(12) United States Patent
Haukka et al.

(10) Patent No.: US 11,174,550 B2
(45) Date of Patent: Nov. 16, 2021

(54) SELECTIVE DEPOSITION ON METAL OR METALLIC SURFACES RELATIVE TO DIELECTRIC SURFACES

(71) Applicant: ASM IP HOLDING B.V., Almere (NL)

(72) Inventors: Suvi P. Haukka, Helsinki (FI); Raija H. Matero, Helsinki (FI); Elina Färm, Helsinki (FI); Tom E. Blomberg, Vantaa (FI)

(73) Assignee: ASM IP HOLDING B.V., Almere (NL)

( * ) Notice: Subject to any disclaimer, the term of this patent is extended or adjusted under 35 U.S.C. 154(b) by 141 days.

(21) Appl. No.: 16/575,112

(22) Filed: Sep. 18, 2019

(65) Prior Publication Data

US 2020/0010953 A1  Jan. 9, 2020

Related U.S. Application Data

(63) Continuation of application No. 15/221,453, filed on Jul. 27, 2016, now Pat. No. 10,428,421.
(Continued)

(51) Int. Cl.
| | |
|---|---|
| *C23C 16/455* | (2006.01) |
| *C23C 16/40* | (2006.01) |
| *C23C 16/04* | (2006.01) |

(52) U.S. Cl.
CPC ........ *C23C 16/45525* (2013.01); *C23C 16/04* (2013.01); *C23C 16/405* (2013.01)

(58) Field of Classification Search
CPC .......................... C23C 16/04; C23C 16/45525
See application file for complete search history.

(56) References Cited

U.S. PATENT DOCUMENTS

| | | | |
|---|---|---|---|
| 4,804,640 | A | 2/1989 | Kaganowicz |
| 4,863,879 | A | 9/1989 | Kwok |

(Continued)

FOREIGN PATENT DOCUMENTS

| | | |
|---|---|---|
| EP | 0469456 A1 | 2/1992 |
| EP | 0880168 A2 | 11/1998 |

(Continued)

OTHER PUBLICATIONS

Aaltonen et al., "Atomic Layer Deposition of Iridium Thin Films", Journal of The Electrochemical Society, 151 (8) G489-G492 (2004).
(Continued)

*Primary Examiner* — Joseph A Miller, Jr.
(74) *Attorney, Agent, or Firm* — Knobbe, Martens, Olson & Bear LLP

(57) ABSTRACT

Methods are provided for selectively depositing a material on a first metal or metallic surface of a substrate relative to a second, dielectric surface of the substrate, or for selectively depositing metal oxides on a first metal oxide surface of a substrate relative to a second silicon oxide surface. The selectively deposited material can be, for example, a metal, metal oxide, metal nitride, metal silicide, metal carbide and/or dielectric material. In some embodiments a substrate comprising a first metal or metallic surface and a second dielectric surface is alternately and sequentially contacted with a first vapor-phase metal halide reactant and a second reactant. In some embodiments a substrate comprising a first metal oxide surface and a second silicon oxide surface is alternately and sequentially contacted with a first vapor phase metal fluoride or chloride reactant and water.

20 Claims, 3 Drawing Sheets

Related U.S. Application Data

(60) Provisional application No. 62/281,593, filed on Jan. 21, 2016, provisional application No. 62/200,502, filed on Aug. 3, 2015.

(56) References Cited

U.S. PATENT DOCUMENTS

| | | |
|---|---|---|
| 4,948,755 A | 8/1990 | Mo |
| 5,288,697 A | 2/1994 | Schrepp et al. |
| 5,447,887 A | 9/1995 | Filipiak et al. |
| 5,604,153 A | 2/1997 | Tsubouchi et al. |
| 5,633,036 A | 5/1997 | Seebauer et al. |
| 5,869,135 A | 2/1999 | Vaeth et al. |
| 5,925,494 A | 7/1999 | Horn |
| 6,046,108 A | 4/2000 | Liu et al. |
| 6,375,693 B1 | 4/2002 | Cote et al. |
| 6,416,577 B1 | 7/2002 | Suntoloa et al. |
| 6,426,015 B1 | 7/2002 | Xia et al. |
| 6,455,414 B1 | 9/2002 | Hillman et al. |
| 6,482,740 B2 | 11/2002 | Soininen et al. |
| 6,586,330 B1 | 7/2003 | Ludviksson et al. |
| 6,679,951 B2 | 1/2004 | Soininen et al. |
| 6,759,325 B2 | 7/2004 | Raaijmakers et al. |
| 6,811,448 B1 | 11/2004 | Paton |
| 6,844,258 B1 | 1/2005 | Fair et al. |
| 6,852,635 B2 | 2/2005 | Satta et al. |
| 6,858,533 B2 | 2/2005 | Chu et al. |
| 6,878,628 B2 | 4/2005 | Sophie et al. |
| 6,887,795 B2 | 5/2005 | Soininen et al. |
| 6,921,712 B2 | 7/2005 | Soininen et al. |
| 6,958,174 B1 | 10/2005 | Klaus et al. |
| 7,041,609 B2 | 5/2006 | Vaartstra |
| 7,067,407 B2 | 6/2006 | Kostamo et al. |
| 7,084,060 B1 | 8/2006 | Furukawa et al. |
| 7,118,779 B2 | 10/2006 | Verghese et al. |
| 7,220,669 B2 | 5/2007 | Hujanen et al. |
| 7,241,677 B2 | 7/2007 | Soininen et al. |
| 7,323,411 B1 | 1/2008 | Blosse |
| 7,344,603 B2 | 3/2008 | Shimizu et al. |
| 7,405,143 B2 | 7/2008 | Leinikka et al. |
| 7,425,350 B2 | 9/2008 | Todd |
| 7,476,618 B2 | 1/2009 | Kilpela et al. |
| 7,494,927 B2 | 2/2009 | Kostamo et al. |
| 7,595,271 B2 | 9/2009 | White |
| 7,611,751 B2 | 11/2009 | Elers |
| 7,695,567 B2 | 4/2010 | Fu |
| 7,754,621 B2 | 7/2010 | Putkonen |
| 7,790,631 B2 | 9/2010 | Sharma et al. |
| 7,799,135 B2 | 9/2010 | Verghese et al. |
| 7,910,177 B2 | 3/2011 | Li |
| 7,914,847 B2 | 3/2011 | Verghese et al. |
| 7,927,942 B2 | 4/2011 | Raaijmakers |
| 7,951,637 B2 | 5/2011 | Weidman et al. |
| 7,955,979 B2 | 6/2011 | Kostamo et al. |
| 7,964,505 B2 | 6/2011 | Khandelwal et al. |
| 8,173,554 B2 | 5/2012 | Lee et al. |
| 8,222,135 B2 | 7/2012 | Streck et al. |
| 8,278,176 B2 | 10/2012 | Bauer et al. |
| 8,293,597 B2 | 10/2012 | Raaijmakers |
| 8,293,658 B2 | 10/2012 | Shero et al. |
| 8,368,222 B2 | 2/2013 | Okuyama |
| 8,425,739 B1 | 4/2013 | Wieting |
| 8,466,052 B2 | 6/2013 | Baek et al. |
| 8,470,720 B2 | 6/2013 | Nakao et al. |
| 8,536,058 B2 | 9/2013 | Kostamo et al. |
| 8,623,468 B2 | 1/2014 | Lin et al. |
| 8,778,815 B2 | 7/2014 | Yamaguchi et al. |
| 8,890,264 B2 | 11/2014 | Dewey et al. |
| 8,956,971 B2 | 2/2015 | Haukka et al. |
| 8,962,482 B2 | 2/2015 | Albertson et al. |
| 8,980,418 B2 | 3/2015 | Darling et al. |
| 8,993,404 B2 | 3/2015 | Korbrinsky et al. |
| 9,024,312 B2 | 5/2015 | Fukuda et al. |
| 9,067,958 B2 | 6/2015 | Romero |
| 9,112,003 B2 | 8/2015 | Haukka et al. |
| 9,129,897 B2 | 9/2015 | Pore et al. |
| 9,136,110 B2 | 9/2015 | Rathsack |
| 9,159,558 B2 | 10/2015 | Cheng et al. |
| 9,236,292 B2 | 1/2016 | Romero et al. |
| 9,257,303 B2 | 2/2016 | Haukka et al. |
| 9,312,131 B2 | 4/2016 | Bauer et al. |
| 9,343,297 B1 | 5/2016 | Fukazawa et al. |
| 9,349,687 B1 | 5/2016 | Gates et al. |
| 9,353,139 B2 | 5/2016 | Sundermeyer et al. |
| 9,455,138 B1 | 9/2016 | Fukazawa et al. |
| 9,490,145 B2 | 11/2016 | Niskanen et al. |
| 9,502,289 B2 | 11/2016 | Haukka et al. |
| 9,552,979 B2 | 1/2017 | Knaepen et al. |
| 9,563,209 B2 | 2/2017 | Inoue et al. |
| 9,679,808 B2 | 6/2017 | Haukka et al. |
| 9,786,491 B2 | 10/2017 | Suzuki et al. |
| 9,786,492 B2 | 10/2017 | Suzuki et al. |
| 9,803,277 B1 | 10/2017 | Longrie et al. |
| 9,805,974 B1 | 10/2017 | Chen et al. |
| 9,816,180 B2 | 11/2017 | Haukka et al. |
| 9,895,715 B2 | 2/2018 | Haukka et al. |
| 9,911,595 B1 | 3/2018 | Smith et al. |
| 10,014,212 B2 | 7/2018 | Chen et al. |
| 10,041,166 B2 | 8/2018 | Longrie et al. |
| 10,047,435 B2 | 8/2018 | Haukka et al. |
| 10,049,924 B2 | 8/2018 | Haukka et al. |
| 10,093,687 B2 | 10/2018 | Sundermeyer et al. |
| 10,115,603 B2 | 10/2018 | Niskanen et al. |
| 10,121,699 B2 | 11/2018 | Wang et al. |
| 10,157,786 B2 | 12/2018 | Haukka et al. |
| 10,186,420 B2 | 1/2019 | Fukazawa |
| 10,204,782 B2 | 2/2019 | Maes et al. |
| 10,343,186 B2 | 7/2019 | Pore et al. |
| 10,373,820 B2 | 8/2019 | Tois et al. |
| 10,421,766 B2 | 9/2019 | Spence et al. |
| 10,428,421 B2 | 10/2019 | Haukka et al. |
| 10,443,123 B2 | 10/2019 | Haukka et al. |
| 10,453,701 B2 | 10/2019 | Tois et al. |
| 10,456,808 B2 | 10/2019 | Haukka et al. |
| 10,480,064 B2 | 11/2019 | Longrie et al. |
| 10,546,741 B2 | 1/2020 | Muramaki et al. |
| 10,553,482 B2 | 2/2020 | Wang et al. |
| 10,566,185 B2 | 2/2020 | Wang et al. |
| 10,695,794 B2 | 6/2020 | Pore et al. |
| 10,741,411 B2 | 8/2020 | Niskanen et al. |
| 10,793,946 B1 | 10/2020 | Longrie et al. |
| 10,814,349 B2 | 10/2020 | Pore et al. |
| 10,847,361 B2 | 11/2020 | Wang et al. |
| 10,847,363 B2 | 11/2020 | Tapily |
| 10,854,460 B2 | 12/2020 | Tois et al. |
| 10,872,765 B2 | 12/2020 | Tois et al. |
| 10,899,500 B2 | 1/2021 | Xiao et al. |
| 10,900,120 B2 | 1/2021 | Sharma et al. |
| 10,903,113 B2 | 1/2021 | Wang et al. |
| 10,923,361 B2 | 2/2021 | Tois et al. |
| 11,047,040 B2 | 6/2021 | Haukka et al. |
| 11,056,385 B2 | 7/2021 | Haukka et al. |
| 2001/0019803 A1 | 9/2001 | Mirkanimi |
| 2001/0021414 A1 | 9/2001 | Morishima et al. |
| 2001/0025205 A1 | 9/2001 | Chern et al. |
| 2002/0027261 A1 | 3/2002 | Blesser et al. |
| 2002/0047144 A1 | 4/2002 | Nguyen et al. |
| 2002/0068458 A1 | 6/2002 | Chiang et al. |
| 2002/0090777 A1 | 7/2002 | Forbes et al. |
| 2002/0107316 A1 | 8/2002 | Bice et al. |
| 2003/0027431 A1 | 2/2003 | Sneh et al. |
| 2003/0066487 A1 | 4/2003 | Suzuki |
| 2003/0143839 A1 | 7/2003 | Raaijmakers et al. |
| 2003/0176559 A1 | 9/2003 | Bice et al. |
| 2003/0181035 A1 | 9/2003 | Yoon et al. |
| 2003/0185997 A1 | 10/2003 | Hsieh |
| 2003/0192090 P1 | 10/2003 | Meilland |
| 2003/0193090 A1 | 10/2003 | Otani et al. |
| 2004/0092073 A1 | 5/2004 | Cabral |
| 2004/0129558 A1 | 7/2004 | Liu et al. |
| 2004/0219746 A1 | 11/2004 | Vaartstra et al. |
| 2005/0012975 A1 | 1/2005 | George et al. |
| 2005/0037153 A1 | 2/2005 | Schmitt et al. |
| 2005/0136604 A1 | 6/2005 | Al-Bayati et al. |

(56) References Cited

U.S. PATENT DOCUMENTS

| | | |
|---|---|---|
| 2005/0160575 A1 | 7/2005 | Gambino et al. |
| 2005/0223989 A1 | 10/2005 | Lee et al. |
| 2006/0019493 A1 | 1/2006 | Li |
| 2006/0047132 A1 | 3/2006 | Shenai-Khatkhate et al. |
| 2006/0121271 A1 | 6/2006 | Frey et al. |
| 2006/0121677 A1 | 6/2006 | Parekh et al. |
| 2006/0121733 A1 | 6/2006 | Kilpela et al. |
| 2006/0128150 A1 | 6/2006 | Gandikota et al. |
| 2006/0141155 A1 | 6/2006 | Gordon et al. |
| 2006/0156979 A1 | 7/2006 | Thakur et al. |
| 2006/0176559 A1 | 8/2006 | Takatoshi et al. |
| 2006/0199399 A1 | 9/2006 | Muscat |
| 2006/0226409 A1 | 10/2006 | Burr et al. |
| 2006/0292845 A1 | 12/2006 | Chiang et al. |
| 2007/0014919 A1 | 1/2007 | Hamalainen et al. |
| 2007/0026654 A1 | 2/2007 | Huotari et al. |
| 2007/0036892 A1 * | 2/2007 | Haukka ............ C23C 16/45525 427/248.1 |
| 2007/0063317 A1 | 3/2007 | Kim et al. |
| 2007/0098894 A1 | 5/2007 | Verghese et al. |
| 2007/0099422 A1 | 5/2007 | Wijekoon et al. |
| 2007/0232082 A1 | 10/2007 | Balseanu et al. |
| 2007/0241390 A1 | 10/2007 | Tanaka et al. |
| 2007/0251444 A1 | 11/2007 | Gros-Jean et al. |
| 2007/0292604 A1 | 12/2007 | Dordi et al. |
| 2008/0066680 A1 | 3/2008 | Sherman |
| 2008/0072819 A1 | 3/2008 | Rahtu |
| 2008/0124932 A1 | 5/2008 | Tateishi et al. |
| 2008/0179741 A1 | 7/2008 | Streck et al. |
| 2008/0241575 A1 | 10/2008 | Lavoie et al. |
| 2008/0282970 A1 | 11/2008 | Heys et al. |
| 2009/0035949 A1 | 2/2009 | Niinisto et al. |
| 2009/0071505 A1 | 3/2009 | Miya et al. |
| 2009/0081385 A1 | 3/2009 | Heys et al. |
| 2009/0203222 A1 | 8/2009 | Dussarrat et al. |
| 2009/0269507 A1 | 10/2009 | Yu et al. |
| 2009/0274887 A1 | 11/2009 | Millward et al. |
| 2009/0275163 A1 | 11/2009 | Lacey et al. |
| 2009/0311879 A1 | 12/2009 | Blasco et al. |
| 2010/0015756 A1 | 1/2010 | Weidman et al. |
| 2010/0102417 A1 | 4/2010 | Ganguli et al. |
| 2010/0147396 A1 | 6/2010 | Yamagishi et al. |
| 2010/0178468 A1 | 7/2010 | Jiang et al. |
| 2010/0248473 A1 | 9/2010 | Ishizaka et al. |
| 2010/0270626 A1 | 10/2010 | Raisanen |
| 2010/0297474 A1 | 11/2010 | Dameron |
| 2010/0314765 A1 | 12/2010 | Liang et al. |
| 2011/0039420 A1 | 2/2011 | Nakao |
| 2011/0053800 A1 | 3/2011 | Jung et al. |
| 2011/0120542 A1 | 5/2011 | Levy |
| 2011/0123812 A1 | 5/2011 | Reihs |
| 2011/0124192 A1 | 5/2011 | Ganguli et al. |
| 2011/0146568 A1 | 6/2011 | Haukka et al. |
| 2011/0146703 A1 | 6/2011 | Chen et al. |
| 2011/0198736 A1 | 8/2011 | Shero et al. |
| 2011/0198756 A1 | 8/2011 | Thenappan et al. |
| 2011/0221061 A1 | 9/2011 | Prakash |
| 2011/0244680 A1 | 10/2011 | Tohnoe et al. |
| 2011/0311726 A1 | 12/2011 | Liu et al. |
| 2012/0032311 A1 | 2/2012 | Gates |
| 2012/0046421 A1 | 2/2012 | Darling et al. |
| 2012/0052681 A1 | 3/2012 | Marsh |
| 2012/0088369 A1 | 4/2012 | Weidman et al. |
| 2012/0091541 A1 | 4/2012 | Suchomel et al. |
| 2012/0189868 A1 | 7/2012 | Borovik et al. |
| 2012/0219824 A1 | 8/2012 | Prolier et al. |
| 2012/0241411 A1 | 9/2012 | Darling et al. |
| 2012/0264291 A1 | 10/2012 | Ganguli et al. |
| 2012/0269970 A1 | 10/2012 | Ido et al. |
| 2013/0005133 A1 | 1/2013 | Lee et al. |
| 2013/0078793 A1 | 3/2013 | Sun et al. |
| 2013/0084700 A1 | 4/2013 | Swerts et al. |
| 2013/0084714 A1 | 4/2013 | Oka et al. |
| 2013/0089983 A1 | 4/2013 | Sugita et al. |
| 2013/0095664 A1 | 4/2013 | Matero et al. |
| 2013/0115763 A1 | 5/2013 | Takamure et al. |
| 2013/0115768 A1 | 5/2013 | Pore et al. |
| 2013/0126815 A1 | 5/2013 | Kim et al. |
| 2013/0143401 A1 | 6/2013 | Yu et al. |
| 2013/0146881 A1 | 6/2013 | Yamazaki et al. |
| 2013/0157409 A1 | 6/2013 | Vaidya et al. |
| 2013/0189790 A1 | 7/2013 | Li et al. |
| 2013/0189837 A1 | 7/2013 | Haukka et al. |
| 2013/0196502 A1 | 8/2013 | Haukka et al. |
| 2013/0203267 A1 | 8/2013 | Pomarede et al. |
| 2013/0280919 A1 | 10/2013 | Yuasa et al. |
| 2013/0284094 A1 | 10/2013 | Pavol et al. |
| 2013/0309457 A1 | 11/2013 | Rathsack et al. |
| 2013/0316080 A1 | 11/2013 | Yamaguchi et al. |
| 2013/0319290 A1 | 12/2013 | Xiao et al. |
| 2013/0323930 A1 | 12/2013 | Chattopadhyay et al. |
| 2013/0330936 A1 | 12/2013 | Lachaud et al. |
| 2014/0001572 A1 | 1/2014 | Bohr et al. |
| 2014/0024200 A1 | 1/2014 | Kato et al. |
| 2014/0091308 A1 | 4/2014 | Dasgupta et al. |
| 2014/0120737 A1 | 5/2014 | Swaminathan et al. |
| 2014/0120738 A1 | 5/2014 | Jung et al. |
| 2014/0152383 A1 | 6/2014 | Nikonov et al. |
| 2014/0190409 A1 | 7/2014 | Matsumoto et al. |
| 2014/0193598 A1 | 7/2014 | Traser et al. |
| 2014/0205766 A1 | 7/2014 | Lyon et al. |
| 2014/0209022 A1 | 7/2014 | Inoue et al. |
| 2014/0227461 A1 | 8/2014 | Darwish et al. |
| 2014/0252487 A1 | 9/2014 | Stephens et al. |
| 2014/0272194 A1 | 9/2014 | Xiao et al. |
| 2014/0273290 A1 | 9/2014 | Somervell |
| 2014/0273477 A1 | 9/2014 | Niskanen et al. |
| 2014/0273514 A1 | 9/2014 | Somervell et al. |
| 2014/0273523 A1 | 9/2014 | Rathsack |
| 2014/0273527 A1 | 9/2014 | Niskanen et al. |
| 2014/0349107 A1 | 11/2014 | Thoumazet et al. |
| 2015/0004317 A1 | 1/2015 | Dussarrat et al. |
| 2015/0004319 A1 | 1/2015 | Mizue |
| 2015/0004806 A1 | 1/2015 | Ndiege et al. |
| 2015/0011032 A1 | 1/2015 | Kunimatsu et al. |
| 2015/0011093 A1 | 1/2015 | Singh et al. |
| 2015/0037972 A1 | 2/2015 | Danek et al. |
| 2015/0064931 A1 | 3/2015 | Kumagi et al. |
| 2015/0083415 A1 | 3/2015 | Monroe et al. |
| 2015/0087158 A1 | 3/2015 | Sugita et al. |
| 2015/0093890 A1 | 4/2015 | Blackwell et al. |
| 2015/0097292 A1 | 4/2015 | He et al. |
| 2015/0118863 A1 | 4/2015 | Rathod et al. |
| 2015/0140694 A1 | 5/2015 | Inoue et al. |
| 2015/0162214 A1 | 6/2015 | Thompson et al. |
| 2015/0170961 A1 | 6/2015 | Romero et al. |
| 2015/0179798 A1 | 6/2015 | Clendenning et al. |
| 2015/0184296 A1 | 7/2015 | Xu et al. |
| 2015/0217330 A1 | 8/2015 | Haukka et al. |
| 2015/0240121 A1 | 8/2015 | Sugita et al. |
| 2015/0275355 A1 | 10/2015 | Mallikarjunan et al. |
| 2015/0299848 A1 | 10/2015 | Haukka et al. |
| 2015/0371866 A1 | 12/2015 | Chen et al. |
| 2015/0372205 A1 | 12/2015 | Kimura et al. |
| 2015/0376211 A1 | 12/2015 | Girard et al. |
| 2016/0075884 A1 | 3/2016 | Chen |
| 2016/0079524 A1 | 3/2016 | Do et al. |
| 2016/0086850 A1 | 3/2016 | Romero et al. |
| 2016/0152640 A1 | 6/2016 | Kuchenbeiser et al. |
| 2016/0172189 A1 | 6/2016 | Tapily |
| 2016/0186004 A1 | 6/2016 | Hustad et al. |
| 2016/0190060 A1 | 6/2016 | Bristol et al. |
| 2016/0222504 A1 | 8/2016 | Haukka et al. |
| 2016/0247695 A1 | 8/2016 | Niskanen et al. |
| 2016/0276208 A1 | 9/2016 | Haukka et al. |
| 2016/0284568 A1 | 9/2016 | Morris et al. |
| 2016/0293384 A1 | 10/2016 | Yan et al. |
| 2016/0293398 A1 | 10/2016 | Danek et al. |
| 2016/0315191 A1 | 10/2016 | Tsai et al. |
| 2016/0346838 A1 | 12/2016 | Fujita et al. |
| 2016/0365280 A1 | 12/2016 | Brink et al. |
| 2017/0037513 A1 | 2/2017 | Haukka et al. |
| 2017/0040164 A1 | 2/2017 | Wang et al. |
| 2017/0051405 A1 | 2/2017 | Fukazawa et al. |

(56) References Cited

U.S. PATENT DOCUMENTS

| | | |
|---|---|---|
| 2017/0058401 A1 | 3/2017 | Blackwell et al. |
| 2017/0069527 A1 | 3/2017 | Haukka et al. |
| 2017/0100742 A1 | 4/2017 | Pore et al. |
| 2017/0100743 A1 | 4/2017 | Pore et al. |
| 2017/0107413 A1 | 4/2017 | Wang et al. |
| 2017/0154806 A1 | 6/2017 | Wang et al. |
| 2017/0256402 A1 | 9/2017 | Kaufman-Osborn et al. |
| 2017/0298503 A1 | 10/2017 | Maes et al. |
| 2017/0301542 A1 | 10/2017 | Maes et al. |
| 2017/0323776 A1 | 11/2017 | Färm et al. |
| 2017/0332179 A1 | 11/2017 | Bright et al. |
| 2017/0352533 A1 | 12/2017 | Tois et al. |
| 2017/0352550 A1 | 12/2017 | Tois et al. |
| 2017/0358482 A1 | 12/2017 | Chen et al. |
| 2018/0010247 A1 | 1/2018 | Niskanen et al. |
| 2018/0040708 A1 | 2/2018 | Narayanan et al. |
| 2018/0073136 A1 | 3/2018 | Haukka et al. |
| 2018/0080121 A1 | 3/2018 | Longrie et al. |
| 2018/0096888 A1 | 4/2018 | Naik et al. |
| 2018/0142348 A1 | 5/2018 | Yu et al. |
| 2018/0151345 A1 | 5/2018 | Haukka et al. |
| 2018/0151355 A1 | 5/2018 | Fukazawa |
| 2018/0182618 A1 | 6/2018 | Blanquart et al. |
| 2018/0222933 A1 | 8/2018 | Romero |
| 2018/0233350 A1 | 8/2018 | Tois et al. |
| 2018/0243787 A1 | 8/2018 | Haukka et al. |
| 2018/0350587 A1 | 12/2018 | Jia et al. |
| 2019/0017170 A1 | 1/2019 | Sharma et al. |
| 2019/0057858 A1 | 2/2019 | Hausmann et al. |
| 2019/0074441 A1 | 3/2019 | Kikuchi et al. |
| 2019/0100837 A1 | 4/2019 | Haukka et al. |
| 2019/0155159 A1 | 5/2019 | Knaepen et al. |
| 2019/0164749 A1 | 5/2019 | Tapily |
| 2019/0181004 A1 | 6/2019 | Tang et al. |
| 2019/0283077 A1 | 9/2019 | Pore et al. |
| 2019/0333761 A1 | 10/2019 | Tois et al. |
| 2019/0341245 A1 | 11/2019 | Tois et al. |
| 2020/0051829 A1 | 2/2020 | Tois et al. |
| 2020/0066512 A1 | 2/2020 | Tois et al. |
| 2020/0105515 A1 | 4/2020 | Maes et al. |
| 2020/0122191 A1 | 4/2020 | Haukka et al. |
| 2020/0324316 A1 | 10/2020 | Pore et al. |
| 2020/0325573 A1 | 10/2020 | Illiberi et al. |
| 2020/0365416 A1 | 11/2020 | Niskanen et al. |
| 2021/0001373 A1 | 1/2021 | Pore et al. |
| 2021/0115559 A1 | 4/2021 | Sharma et al. |
| 2021/0118669 A1 | 4/2021 | Tois et al. |
| 2021/0134586 A1 | 5/2021 | Maes et al. |

FOREIGN PATENT DOCUMENTS

| | | |
|---|---|---|
| EP | 1340269 | 2/2009 |
| EP | 3026055 | 6/2016 |
| JP | H08-222569 | 8/1996 |
| JP | 2001127068 | 5/2001 |
| JP | 2008311603 | 12/2008 |
| JP | 2011018742 | 1/2011 |
| JP | 2011-187583 | 9/2011 |
| JP | 2013-229622 | 11/2013 |
| JP | 2014-93331 | 5/2014 |
| KR | 102001001072 | 2/2001 |
| KR | 1020020010821 | 2/2002 |
| KR | 20030027392 | 4/2003 |
| KR | 1020040056026 | 6/2004 |
| KR | 1020050103811 | 11/2005 |
| KR | 10-0920033 | 10/2009 |
| TW | 2005-39321 | 12/2005 |
| TW | 2010-05827 | 2/2010 |
| TW | 2014-39365 | 10/2014 |
| WO | WO 2002/045167 | 6/2002 |
| WO | WO 2011/156705 | 12/2011 |
| WO | WO 2013/161772 | 10/2013 |
| WO | WO 2014/156782 | 10/2014 |
| WO | WO 2014209390 A1 | 12/2014 |
| WO | WO 2015/047345 | 4/2015 |
| WO | WO 2015094305 A1 | 6/2015 |
| WO | WO 2015147843 A1 | 10/2015 |
| WO | WO 2015147858 A1 | 10/2015 |
| WO | WO 2016/178978 | 11/2016 |
| WO | WO 2017/184357 | 10/2017 |
| WO | WO 2017/184358 | 10/2017 |
| WO | WO 2018/204709 | 11/2018 |
| WO | WO 2018/213018 | 11/2018 |

OTHER PUBLICATIONS

Au et al., "Selective Chemical Vapor Deposition of Manganese Self-Aligned Capping Layer for Cu Interconnections in Microelectronics", Journal of the Electrochemical Society, vol. 157, No. 6, 2010, pp. D341-D345.

Benzotriazole, Wikipedia via https://en.wikipedia.org/wiki/Benzotriazole; pp. 1-5, no date available.

Bernal-Ramos, et al., "Atomic Layer Deposition of Cobalt Silicide Thin Films Studied by in Situ Infrared Spectroscopy", Chem. Mater. 2015, 27, pp. 4943-4949.

Bouteville et al., "Selective R.T.L.P.C.V.D. of Tungsten by Silane Reduction on Patterned PPQ/Si Wafers" Journal De Physique IV, Colloque C2, suppl. au Journal de Physique II, vol. 1, Sep. 1991, pp. C2-857-C2-864.

Burton, B.B et al., "Atomic Layer Deposition of MgO Using Bis(ethylcyclopentadienyl)magnesium and H20". J. Phys. Chem. C, 2009, 113, 1939-1946.

Burton, B.B., et al., "SiO2 Atomic Layer Deposition Using Tris(dimethylamino)silane and Hydrogen Peroxide Studied by in Situ Transmission FTIR Spectroscopy". J. Phys. Chem. C, 2009, 113, 8249-8257.

Carlsson, J., "Precursor Design for Chemical Vapour Deposition", Acta Chemica Scandinavica, vol. 45, 1991, pp. 864-869.

Chang et al., "Influences of damage and contamination from reactive ion etching on selective tungsten deposition in a low-pressure chemical-vapor-deposition reactor", J. Appl. Phys., vol. 80, No. 5, Sep. 1, 1996, pp. 3056-3061.

Chen et al., Highly Stable Monolayer Resists for Atomic Layer Deposition on Germanium and Silicon, Chem. Matter, vol. 18, No. 16, pp. 3733-3741, 2006.

Coclite, et al.; 25th Anniversary Article: CVD Polymers: A New Paradigm for Surface Modification and Device Fabrication; Advanced Materials; Oct. 2013; 25; pp. 5392-5423.

Elam et al., "Kinetics of the WF6 and Si2H6 surface reactions during tungsten atomic layer deposition", Surface Science, vol. 479, 2001, pp. 121-135.

Elam et al., "Nucleation and growth during tungsten atomic layer deposition on SiO2 surfaces", Thin Solid Films, vol. 386, 2001 pp. 41-52.

Ellinger et al., "Selective Area Spatial Atomic Layer Deposition of ZnO, Al2O3, and Aluminum-Doped ZnO Using Poly(vinyl pyrrolidone)", Chem. Mater. 2014, 26, pp. 1514-1522.

Fabreguette et al., Quartz crystal microbalance study of tungsten atomic layer deposition using WF6 and Si2H6, Thin Solid Films, vol. 488, 2005, pp. 103-110.

Farm et al. Selective-Area Atomic Layer Deposition Using Poly(methyl methacrylate) Films as Mask Layers, J. Phys. Chem. C, 2008, 112, pp. 15791 -15795. (Year: 2008).

Farm et al., "Self-Assembled Octadecyltrimethoxysilane Monolayers Enabling Selective-Area Atomic Layer Deposition of Iridium", Chem. Vap. Deposition, 2006, 12, pp. 415-417.

Farr, Isaac Vincent; Synthesis and Characterization of Novel Polyimide Gas Separation Membrane Material Systems, Chapter 2; Virginia Tech Chemistry PhD Dissertation; URN# etd-080999-123034; Jul. 26, 1999.

File History of U.S. Appl. No. 14/612,784, filed Feb. 3, 2015.
File History of U.S. Appl. No. 15/877,632, filed Jan. 23, 2018.
File History of U.S. Appl. No. 16/657,307, filed Oct. 18, 2019.
File History of U.S. Appl. No. 14/687,833, filed Apr. 15, 2015.
File History of U.S. Appl. No. 16/100,855, filed Aug. 10, 2018.
File History of U.S. Appl. No. 16/594,365, filed Oct. 7, 2019.
File History of U.S. Appl. No. 14/628,799, filed Feb. 23, 2015.
File History of U.S. Appl. No. 15/331,366, filed Oct. 21, 2016.

(56) References Cited

OTHER PUBLICATIONS

File History of U.S. Appl. No. 16/143,888, filed Sep. 27, 2018.
File History of U.S. Appl. No. 14/817,161, filed Aug. 3, 2015.
File History of U.S. Appl. No. 14/819,274, filed Aug. 5, 2015.
File History of U.S. Appl. No. 15/432,263, filed Feb. 14, 2017.
File History of U.S. Appl. No. 16/158,780, filed Oct. 12, 2018.
File History of U.S. Appl. No. 15/221,453, filed Jul. 27, 2016.
File History of U.S. Appl. No. 15/177,195, filed Jun. 8, 2016.
File History of U.S. Appl. No. 15/795,768, filed Oct. 27, 2017.
File History of U.S. Appl. No. 16/040,844, filed Jul. 20, 2018.
File History of U.S. Appl. No. 16/676,017, filed Nov. 6, 2019.
File History of U.S. Appl. No. 15/581,726, filed Apr. 28, 2017.
File History of U.S. Appl. No. 15/364,024, filed Nov. 29, 2016.
File History of U.S. Appl. No. 15/892,728, filed Feb. 9, 2018.
File History of U.S. Appl. No. 15/971,601, filed May 4, 2018.
File History of U.S. Appl. No. 13/708,863, filed Dec. 7, 2012.
File History of U.S. Appl. No. 14/737,293, filed Jun. 11, 2015.
File History of U.S. Appl. No. 15/356,306, filed Nov. 18, 2016.
File History of U.S. Appl. No. 16/213,479, filed Dec. 7, 2018.
File History of U.S. Appl. No. 13/702,992, filed Mar. 26, 2013.
File History of U.S. Appl. No. 14/613,183, filed Feb. 3, 2015.
File History of U.S. Appl. No. 14/988,374, filed Jan. 5, 2016.
File History of U.S. Appl. No. 15/609,497, filed May 31, 2017.
File History of U.S. Appl. No. 16/100,581, filed Aug. 10, 2018.
Formic Acid, Wikipedia via https://en.wikipedia.org/wiki/Formic_acid; pp. 1-5, no date available.
George, Steven M., "Atomic Layer Deposition: An Overview", Chem. Rev. 2010, 110, pp. 111-113.
Ghosal et al., Controlling Atomic Layer Deposition of Ti02 in Aerogels through Surface Functionalization, Chem. Matter, vol. 21, pp. 1989-1992, 2009.
Grubbs et al., "Nucleation and growth during the atomic layer deposition of W on Al2O3 and Al2O3 on W", Thin Solid Films, vol. 467, 2004, pp. 16-27.
Hashemi et al., "A New Resist for Area Selective Atomic and Molecular Layer Deposition on Metal-Dielectric Patterns", J. Phys. Chem. C 2014, 118, pp. 10957-10962.
Hashemi et al., "Selective Deposition of Dieletrics: Limits and Advantages of Alkanethiol Blocking Agents on Metal-Dielectric Patterns", ACS Appl. Mater. Interfaces 2016, 8, pp. 33264-33272.
Hymes et al., "Surface cleaning of copper by thermal and plasma treatment in reducing and inert ambients", J. Vac. Sci. Technol. B, vol. 16, No. 3, May/Jun. 1998, pp. 1107-1109.
International Search Report and Written Opinion dated Feb. 17, 2012 in Application No. PCT/US2011/039970, filed Jun. 10, 2011.
Klaus et al., "Atomic layer deposition of tungsten using sequential surface chemistry with a sacrificial stripping reaction", Thin Solid Films, vol. 360, 2000, pp. 145-153.
Klaus et al., "Atomically controlled growth of tungsten and tungsten nitride using sequential surface reactions", Applied Surface Science 162-163, 2000, pp. 479-491.
King, "Dielectric Barrier, Etch Stop, and Metal Capping Materials for State of the Art and beyond Metal Interconnects", ECS Journal of Solid State Science and Technology, vol. 4, Issue 1, pp. N3029-N3047, 2015.
Kukli et al., "Properties of hafnium oxide films grown by atomic layer deposition from hafnium tetraiodide and oxygen", J. Appl. Phys., vol. 92, No. 10, Nov. 15, 2002, pp. 5698-5703.
Lecordier et al., "Vapor-deposited octadecanethlol masking layer on copper to enable area selective Hf3N4 atomic layer deposition on dielectrics studied by in situ spectroscopic ellipsometry", J. Vac. Sci. Technol. A36(3), May/Jun. 2018, pp. 031605-1-031605-8.
Lee et al., Area-Selective Atomic Layor Deposition Using Self-Assembled Monolayer and Scanning Probe Lithography, Journal of The Electrochemical Society, vol. 156, Issue 9, pp. G125-G128, 2009.
Lei et al., "Real-time observation and opitimization of tungsten atomic layer deposition process cycle", J. Vac. Sci. Technol. B, vol. 24, No. 2, Mar./Apr. 2006, pp. 780-789.

Lemonds, Andrew Michael, "Atomic Layer Deposition and Properties of Refractory Transition Metal-Based Copper-Diffusion Barriers for ULSI Interconnect", The University of Texas at Austin, 2003, pp. 1-197.
Lemonds, A.M., "Atomic layer deposition of TaSix thin films on SiO2 using TaF5 and Si2H6", Thin Solid Films 488, 2005 pp. 9-14.
Leusink et al., "Growth kinetics and inhibition of growth of chemical vapor deposited thin tungsten films on silicon from tungsten hexafluoride", J. Appl. Phys., vol. 72, No. 2, Jul. 15, 1992, pp. 490-498.
Liang, Xuehai, et al., "Growth of Ge Nanofilms Using Electrochemical Atomic Layer Deposition, with a "Bait and Switch" Surface-Limited Reaction". Journal of the American Chemical Society, 2011, 133, 8199-8024.
Lohokare et al., "Reactions of Disilane on Cu(111): Direct Observation of Competitive Dissociation, Disproportionation, and Thin Film Growth Processes", Langmuir 1995, vol. 11, pp. 3902-3912.
Low et al., Selective deposition of CVD iron on silicon dioxide and tungsten, Microelectronic Engineering 83, pp. 2229-2233, 2006.
Mackus et al., Influence of Oxygen Exposure on the Nucleation of Platinum Atomic Layer Deposition: Consequences for Film Growth, Nanopatterning, and Nanoparticle Synthesis, Chem. Matter, vol. 25, pp. 1905-1911, 2013.
Mackus et al., Local deposition of high-purity Pt nanostructures by combining electron beam induced deposition and atomic layer deposition, Journal of Applied Physics, vol. 107, pp. 116102-1-116102-3, 2010.
Mackus et al., "The use of atomic layer deposition in advanced nanopatterning", Nanoscale, 2014, 6, pp. 10941-10960.
Maluf et al., "Selective tungsten filling of sub-0.25µm trenches for the fabrication of scaled contacts and x-ray masks", J. Vac. Sci. Technol. B, vol. 8, No. 3, May/Jun. 1990, pp. 568-569.
Norrman, et al.; 6 Studies of Spin-Coated Polymer Films; Annu. Rep. Prag. Chem.; Sect. C; 2005; 101; pp. 174-201.
Office Action dated Jun. 8, 2017 in Korean Application No. 2013-7000596.
Overhage et al., Selective Atomic Layer Deposition (SALD) of Titanium Dioxide on Silicon and Copper Patterned Substrates, Journal of Undergraduate Research 4, Mar. 29, 2011 in 4 pages.
Parulekar et al., Atomic Layer Deposition of Zirconium Oxide on Copper Patterned Silicon Substrate, Journal of Undergraduate Research, vol. 7, pp. 15-17, 2014.
Parulekar et al., Selective atomic layer deposition of zirconium oxide on copper patterned silicon substrate, pp. 1-6, 2013.
Prasittichai et al., "Area Selective Molecular Layer Deposition of Polyurea Film", Applied Materials & Interfaces, 2013, vol. 5, pp. 13391-13396.
Proslier et al., "Atomic Layer Deposition and Superconducting Properties of NbSi Films", The Journal of Physical Chemistry C, 2011, vol. 115, No. 50, pp. 1-26.
Putkonen, et al.; Atomic Layer Deposition Of Polyimide Thin Films; Journal of Materials Chemistry; 2007, 17, pp. 664-669.
Ratta, Varun; Crystallization, Morphology, Thermal Stability and Adhesive Properties of Novel High Performance Semicrystalline Polyimides, Chapter 1; Virginia Tech Chemistry PhD Dissertation; URN #etd-051799-162256; Apr. 26, 1999.
Roberts et al., "Selective Mn deposition on Cu lines", poster presentation, 12th International Conference on Atomic Layer Deposition, Jun. 19, 2012, Dresden, Germany.
Sapp, et al.; Thermo-Mechanical and Electrical Characterization of Through-Silicon Vias with a Vapor Deposited Polyimide Dielectric Liner; IEEE; 2012.
Schmeißer, Decomposition of formic acid, Chemnitz University of Technology, pp. 1-13, Aug. 31, 2011.
Schmeißer, Reduction of Copper Oxide by Formic Acid an ab-initio study, Chemnitz University of Technology, pp. 1-42, Sep. 2011.
Selvaraj et al., Selective atomic layer deposition of zirconia on copper patterned silicon substrates using ethanol as oxygen source as well as copper reductant, Journal of Vacuum Science & Technology A, vol. 32, No. 1, pp. 010601-1-010601-4, Jan. 2014.
Senesky et al., "Aluminum nitride as a masking material for the plasma etching of silicon carbide structures," 2010, IEEE, pp. 352-355.

(56) References Cited

OTHER PUBLICATIONS

Schuiskly et al., "Atomic Layer Deposition of Thin Films Using O2 as Oxygen Source", Langmuir, vol. 17, No. 18, 2001, pp. 5508-5512.

Sundberg, et al.; Organic and Inorganic-Organic Thin Film Structures By Molecular Layer Deposition: A Review; Beilstein J. Nanotechnol; 2014, 5, pp. 1104-1136.

Suntola, Tuomo, "Thin Films and Epitaxy Part B: Grown mechanism and Dynamics", Handbook of Crystal Growth vol. 3, Elsevier, 1994, 33 pages.

Ting, et al., "Selective Electroless Metal Deposition for Integrated Circuit Fabrication", J. Electrochem. Soc., vol. 136, No. 2, Feb. 1989, pp. 456-462.

Toirov, et al.; Thermal Cyclodehydration of Polyamic Acid Initiated by UV-Irradiation; Iranian Polymer Journal; vol. 5, No. 1; pp. 1A323:C3286-22; 1996; Iran.

"Tungsten and Tungsten Silicide Chemical Vapor Deposition", TimeDomain CVD, Inc., retrieved from link: http://www.timedomaincvd.com/CVD_Fundamentals/films/W_WSi.html, Last modified Jul. 11, 2008.

Yu et al., "Gas/surface reactions in the chemical vapor deposition of tungsten using WF6/SiH4 mixtures", J. Vac. Sci. Technol. A, vol. 7, No. 3, May/Jun. 1989, pp. 625-629.

Vallat et al., Selective deposition of Ta2O5 by adding plasma etching super-cycles in plasma enhanced atomic layer deposition steps, Journal of Vacuum Science & Technology A, vol. 35, No. 1, pp. 01B104-1-01B104-7, Jan. 2017.

Vervuurt et al., "Area-selective atomic layer deposition of platinum using photosensitive polyimide", Nanotechnology 27, 2016, in 6 pages.

Zhou, et al.; Fabrication of Organic Interfacial Layers By Molecular Layer Deposition: Present Status and Future Opportunities; Journal of Vacuum Science & Technology; A 31 (4), 040801-1 to 040801-18; 2013.

Cho et al., "Atomic layer deposition of $Al_2O_3$ thin films using dimethylaluminum isopropoxide and water", Journal of Vacuum Science & Technology A 21, (2003), doi: 10.1116/1.1562184, pp. 1366-1370.

File History of U.S. Appl. No. 16/588,600, filed Sep. 30, 2019.
File History of U.S. Appl. No. 16/836,151, filed Mar. 31, 2020.
File History of U.S. Appl. No. 16/987,990, filed Aug. 7, 2020.
File History of U.S. Appl. No. 17/135,001, filed Dec. 28, 2020.
File History of U.S. Appl. No. 17/113,383, filed Dec. 7, 2020.
File History of U.S. Appl. No. 17/064,865, filed Oct. 7, 2020.
File History of U.S. Appl. No. 16/773,064, filed Jan. 27, 2020.
File History of U.S. Appl. No. 16/033,952, filed Jul. 12, 2018.
File History of U.S. Appl. No. 16/399,328, filed Apr. 30, 2019.
International Search Report and Written Opinion dated Aug. 8, 2018 in Application No. PCT/US2018/030974, filed May 3, 2018.
International Search Report and Written Opinion dated Jul. 24, 2018 in Application No. PCT/US2018/030979, filed May 3, 2018.
File History of U.S. Appl. No. 16/787,672, filed Feb. 11, 2020.
File History of U.S. Appl. No. 16/605,475, filed Oct. 15, 2019.

Hu et al. "Coating strategies for atomic layer deposition", Nanotechnol. Rev. 2017; 6(6): pp. 527-547.

Lin et al., "Selective Deposition of Multiple Sensing Materials on Si Nanobelt Devices through Plasma-Enhanced Chemical Vapor Deposition and Device-Localized Joule Heating", ACS Appl. Mater. Interfaces 2017, 9, 39935-39939, DOI: 10.1021/acsami.7b13896.

Wang et al., "Low-temperature plasma-enhanced atomic layer deposition of tin oxide electron selective layers for highly efficient planar perovskite solar cells", Journal of Materials Chemistry A, 2016, 4, pp. 12080-12087.

\* cited by examiner

SELECTIVE DEPOSITION ON METAL OR METALLIC SURFACES RELATIVE TO DIELECTRIC SURFACES

CROSS-REFERENCE TO RELATED APPLICATIONS

This application is a continuation of U.S. application Ser. No. 15/221,453, filed Jul. 27, 2016, which claims priority to U.S. Provisional Application No. 62/200,502, filed Aug. 3, 2015, and U.S. Provisional Application No. 62/281,593, filed Jan. 21, 2016, each of which is hereby incorporated by reference in its entirety.

BACKGROUND

Field

The present application relates to selective deposition of a material on a first metal or metallic surface of a substrate relative to a second dielectric surface, such as an $SiO_2$ surface.

Description of the Related Art

Integrated circuits are currently manufactured by an elaborate process in which various layers of materials are sequentially constructed in a predetermined arrangement on a semiconductor substrate.

The predetermined arrangement of materials on a semiconductor substrate is often accomplished by deposition of a material over the entire substrate surface, followed by removal of the material from predetermined areas of the substrate, such as by deposition of a mask layer and subsequent selective etching process.

In certain cases, the number of steps involved in manufacturing an integrated surface on a substrate may be reduced by utilizing a selective deposition process, wherein a material is selectively deposited on a first surface relative to a second surface without the need, or with reduced need for subsequent processing. Methods are disclosed herein for selective deposition on a first metal or metallic surface of substrate relative to a second, dielectric surface of the substrate.

BRIEF DESCRIPTION OF THE DRAWINGS

The application will be better understood from the Description and from the appended drawings, which are meant to illustrate and not to limit the invention, and wherein.

DETAILED DESCRIPTION

Figure 1:
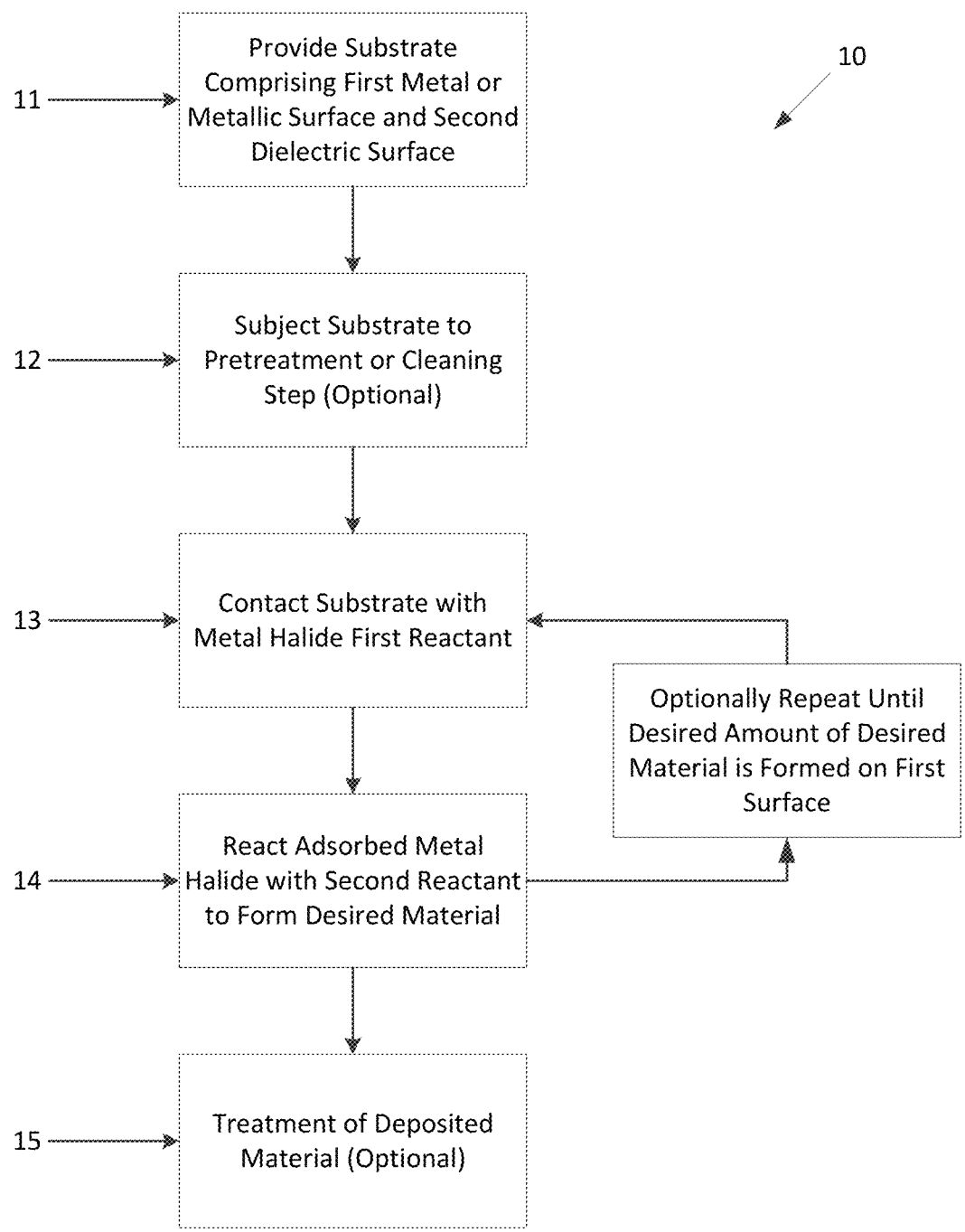
FIG. 1 is a process flow diagram generally illustrating a process for selectively depositing a material on a first metal surface of a substrate relative to a second dielectric surface of the same substrate.

According to some aspects of the present disclosure, selective deposition without need for any separate passivation chemicals or blocking agents, can be used to deposit a material on a first surface relative to a second surface. In some embodiments however, passivation chemicals or blocking agents may be used, if desired. These may include, for example, self-assembled monolayers. In some embodiments a material is selectively deposited on a first metal or metallic surface of a substrate relative to a second, dielectric surface of the substrate. In some embodiments the second surface comprises —OH groups, such as a $SiO_2$ based surface. In some embodiments a metal oxide such as $NbO_x$ is selectively deposited on a first metal oxide or dielectric surface of a substrate relative to a second, different $SiO_2$ surface. In some embodiments atomic layer deposition (ALD) type processes are used. After selective deposition of the material is completed, further processing can be carried out to form the desired structures.

Unless otherwise indicated, if a surface is referred to as a metal surface herein, it may be a metal surface or a metallic surface. In some embodiments the metal or metallic surface may comprise metal, for example an elemental metal, metal nitride, metal silicide, metal carbide and/or mixtures thereof. In some embodiments the metal or metallic surface may comprise surface oxidation, for example a surface layer of native metal oxide. In some embodiments the metal or metallic material of the metal or metallic surface is electrically conductive with or without surface oxidation. In some embodiments the metal or metallic surface comprises silicon, such as H-terminated silicon. In some embodiments the metal or metallic surface is a silicon surface such as an H-terminated silicon surface. In some embodiments the metal or metallic surface is not a silicon surface such as a H-terminated silicon surface. The first metal or metallic surface may also be referred to herein as the first surface.

In some embodiments a metal or a metallic surface comprises one or more transition metals. In some embodiments a metal or metallic surface comprises aluminum. In some embodiments the metal or metallic surface comprises one or more of Al, Cu, Co, Ni, W. In some embodiments a metallic surface comprises titanium nitride. In some embodiments the metal or metallic surface comprises one or more noble metals, such as Ru. In some embodiments the metal or metallic surface comprises a conductive metal oxide, such as a noble metal oxide like ruthenium oxide.

In some embodiments a material is selectively deposited on a first metal surface comprising a metal oxide surface. A metal oxide surface may be, for example a tungsten oxide, hafnium oxide, titanium oxide, aluminum oxide, or zirconium oxide surface. In some embodiments a metal oxide surface is an oxidized surface of a metallic material. In some embodiments a metal oxide surface is created by oxidizing at least the surface of a metallic material using oxygen compound, such as compounds comprising $O_3$, $H_2O$, $H_2O_2$, $O_2$, oxygen atoms, plasma or radicals or mixtures thereof. In some embodiments a metal oxide surface is a native oxide formed on a metallic material.

In some embodiments a material is selectively deposited on a first surface comprising a dielectric surface relative to a second $SiO_2$ surface.

In some embodiments a metal, metal oxide, metal silicide, metal carbide or metal nitride or mixture thereof is selectively deposited on a first metal or metallic surface of a substrate relative to a second dielectric surface of the substrate. In some embodiments the material that is selectively deposited is not tungsten or tungsten silicide. The term dielectric is used herein for the sake of simplicity in distinguishing from the other surface, namely the metal or metallic surface. Unless indicated otherwise with respect to particular embodiments, the term dielectric in the context of this application can be understood to cover all surfaces which are electrically non-conducting or have very high resistivity. In some embodiments the dielectric surface may be referred to herein as the second surface. In some embodiments the second surface may comprise any dielectric surface.

In some embodiments a metal oxide is selectively deposited on a first metal surface of a substrate, wherein the metal surface comprises a metal oxide relative to a second $SiO_2$ surface. In some embodiment the first metal oxide surface may be, for example a tungsten oxide, hafnium oxide, titanium oxide, aluminum oxide, or zirconium oxide surface. In some embodiments the metal oxide is deposited on a first dielectric surface relative to a second $SiO_2$ surface. In some embodiments the metal oxide that is deposited on the first metal oxide surface is $NbO_x$, for example $Nb_2O_5$. The second $SiO_2$ surface may be, for example, a native oxide, a thermal oxide or a chemical oxide.

For simplicity, materials, such as films, may be referred to herein by the formula $MO_x$, where M is a metal. The formula $MO_x$ indicates that the material comprises primarily a metal, M, and oxygen, however impurities may also be present in such a material. In some embodiments the formula $MO_x$ indicates that the material is an oxide of the metal M.

FIG. 1 is a process flow diagram generally illustrating a process 10 for selectively depositing a material on a first metal or metallic surface of a substrate relative to a second dielectric surface of the same substrate.

In some embodiments a substrate is provided comprising a first metal or metallic surface and a second dielectric surface at step 11. In some embodiments a substrate is provided that comprises a first metal surface comprising a metal oxide surface. In some embodiments the second surface may comprise —OH groups. In some embodiments the second surface may be a $SiO_2$ based surface. In some embodiments the second surface may comprise Si—O bonds. In some embodiments the second surface may comprise a $SiO_2$ based low-k material. In some embodiments the second surface may comprise more than about 30%, or more than about 50% of $SiO_2$. In some embodiments the second surface may comprise $GeO_2$. In some embodiments the second surface may comprise Ge—O bonds.

In some embodiments a pretreatment or cleaning step 12 is optionally used before contacting the substrate with the first reactant. The pretreatment or cleaning step may comprise a plasma, hydrogen or thermal treatment. For example, in some embodiments an oxidized portion of the metal or metallic surface of the substrate, if any, is optionally reduced. In some embodiments the oxidized surface may be reduced with hydrogen or hydrogen containing plasma, radicals or atoms. In some embodiments the oxidized surface is reduced without plasma, such as by exposure to a carboxylic acid, such as formic acid.

Following the optional pretreatment or cleaning step 12, if conducted, the substrate is contacted with a first reactant that comprises a metal halide at step 13. In some embodiments the metal halide is a metal fluoride or metal chloride. In some embodiments the metal halide is adsorbed selectively on the metal or metallic surface of the substrate relative to the dielectric surface. In some embodiments a greater amount of metal halide adsorbs on the metal or metallic surface relative to the dielectric surface. In some embodiments substantially no metal halide adsorbs on the dielectric surface. In some embodiments no metal halide is adsorbed on the dielectric surface. In some embodiments no substantial or detectable amount of metal halide is adsorbed on the dielectric surface.

In some embodiments a substrate comprising a first metal surface comprising a metal oxide surface and a second $SiO_2$ surface is contacted with a metal halide reactant, such as metal fluoride or metal chloride. For example, the substrate may be contacted with $NbF_5$. In some embodiments the metal halide is adsorbed selectively on the metal oxide surface relative to the $SiO_2$ surface. In some embodiments a greater amount of metal halide adsorbs on the metal oxide surface relative to the $SiO_2$ surface. In some embodiments substantially no metal halide adsorbs on the $SiO_2$ surface. In some embodiments no metal halide is adsorbed on the $SiO_2$ surface. In some embodiments no substantial or detectable amount of metal halide is adsorbed on the $SiO_2$ surface.

In some embodiments the adsorbed metal halide on the metal, metallic or metal oxide surface can then be reacted with one or more additional reactants to form a desired material, such as an oxide or metallic material, a silicide, metal nitride, metal carbide or mixture thereof at step 14. For example, in some embodiments the adsorbed metal halide can be reacted with a second reactant comprising an —OH group, such as water, thereby forming a metal oxide. Additional reactants can be provided in order to obtain the desired material.

In some embodiments after removing the metal halide reactant from the reaction space or exposing the substrate to purge gas, the substrate is contacted with a second reactant at step 14. In some embodiments the second reactant comprises an —OH group. In some embodiments the second reactant is water.

Contacting the substrate with the first metal halide reactant, removing the first metal halide reactant from the reaction space, contacting the substrate with the second reactant and removing the second reactant from the reaction space together can be considered a deposition cycle. That is, steps 13 and 14 can be considered a deposition cycle. In some embodiments removing the metal halide reactant and/or removing the second reactant may be accomplished with the aid of an inert purge gas. The deposition cycle can be repeated multiple times to selectively deposit the desired amount of material on the metal or metallic surface. For example, in some embodiments a thin film of deposited material of a desired thickness can be formed.

Once the material is deposited to a desired thickness on the first metal surface, it can optionally be treated at step 15 to form a desired material. For example, after deposition of a desired thickness, the material deposited in the deposition cycle can be oxidized to form a metal oxide or metal silicate. Oxidation may be carried out, for example, by contacting the substrate with a reactant comprising oxygen, such as water, ozone, oxygen atoms, oxygen radicals or oxygen plasma. In this way a dielectric material can be formed from the deposited material on a metal or metallic surface of the substrate relative to a second, different dielectric surface. In some embodiments other treatment steps may be used to form, for example, metal carbides, metal nitrides, or metal silicides from the deposited material.

In some embodiments, a deposition cycle may be repeated at least 10, 25, 50, 100 or more times prior to treatment.

Reaction conditions, including temperature, the substrate surface(s), and the reactants, including the metal halide reactant can be selected to obtain the desired level of selective deposition of a material on the metal or metallic surface relative to the dielectric surface.

In some embodiments, a metal oxide is selectively deposited on a first metal surface comprising a metal oxide surface or first metal surface comprising a dielectric surface relative to a second $SiO_2$ surface at a temperature of about 250 to about 350° C., or about 295° C. to about 315° C.

In some embodiments one or more of the first and second surfaces may be treated in order to enhance deposition on one surface relative to one or more different surfaces. In some embodiments the first metal or metallic surface is treated in order to enhance deposition on the first surface relative to the second surface. In some embodiments the second surface is treated, or deactivated, in order to decrease deposition on the second surface relative to the first surface. In some embodiments the first surface is treated to enhance deposition and the second surface is treated to decrease deposition, thereby increasing selective deposition on the first surface relative to the second surface. In some embodiments no pretreatment is carried out.

In some embodiments the surface comprising dielectric materials such as $SiO_2$ may comprise hydroxyl, or OH-groups which have the effect of making the surface hydrophilic and may be referred to herein as the second surface, dielectric surface, or second dielectric surface. Such OH-group surface terminations can occur naturally when the second surface is exposed to ambient conditions. In some embodiments the dielectric surface may be treated to provide a hydrophilic OH-terminated surface. In some embodiments a hydrophilic OH-terminated surface may be treated to increase the amount of OH-groups on the surface. For example, the dielectric surface may be exposed to $H_2O$ vapor in order to increase the number of OH-groups at the surface. In some embodiments, for example a second surface treatment may include exposing a dielectric surface to a carrier gas that has flowed through a bubbler at a temperature of between about 20° C. and about 50° C. or between about 25° C. and about 40° C. In some embodiments the dielectric surface is exposed to air containing moisture in order to provide a hydrophilic surface that comprises at least some OH-groups. In some embodiments a dielectric surface is not treated prior to deposition.

As mentioned above, in some embodiments the deposition process is an atomic layer deposition (ALD) type process. In some embodiments the deposition process is a thermal ALD process. In some embodiments the deposition process is a vapor deposition process comprising one or more deposition cycles in which a substrate is alternately and sequentially contacted with a first vapor phase halide reactant and a second vapor phase reactant.

In some embodiments the metal halide is a fluoride or chloride of Nb, Ta, Mo, W, V, or Cr. In some embodiments the metal halide is a fluoride or chloride of Nb or Ta.

In some embodiments the first precursor is selected from $NbCl_5$, $NbF_5$, $TaCl_5$, $TaF_5$, $MoF_x$ (x may be an integer and in some embodiments is 5 or 6), $MoCl_x$ (x may be an integer, and in some embodiments is 5), $WF_6$, $WCl_x$ (x may be an integer and in some embodiments is 5), $VF_x$ (x may be an integer and in some embodiments is 5), $VCl_x$ (x may be an integer and in some embodiments is 4), and $CrF_x$ (x may be an integer and in some embodiments is 5).

In some embodiments the first precursor is selected from $NbCl_5$, $NbF_5$, $TaCl_5$, and $TaF_5$.

In some embodiments the first precursor is selected from $NbF_5$ or $TaF_5$.

In some embodiments the first precursor is selected from $NbCl_5$ or $TaCl_5$.

In some embodiments the first precursor is $NbF_5$.
In some embodiments the first precursor is $TaF_5$.
In some embodiments the first precursor is $NbCl_5$.
In some embodiments the first precursor is $TaCl_5$.

In some embodiments the first precursor is not a tungsten precursor. For example, in some embodiments the first precursor is not $WF_6$.

In some embodiments the second precursor comprises a silane, such as monosilane ($SiH_4$), disilane ($Si_2H_6$) or trisilane ($Si_3H_8$). In some embodiments the second precursor is a dialkylsilane, such as diethylsilane. In some embodiments the second precursor comprises OH bonds or provides OH groups to the surface. In some embodiments the second precursor is water. In some embodiments the second precursor is $H_2O_2$.

In some such embodiments the second reactant may comprise, for example, hydrogen $H_2$, hydrogen plasma, radicals or atoms. In some embodiments the second reactant may be a silane, such as a monosilane, disilane or trisilane. In some embodiments the second precursor does not comprise plasma.

In some embodiments the material that is selectively deposited on the first surface relative to the second surface form a thin film. In some embodiments the thin film that is selectively deposited is a metal thin film.

In some embodiments the thin film that is selectively deposited is a metal oxide thin film. In some embodiments the metal oxide film is formed using water as a second reactant. In some embodiments a metal oxide film is selectively deposited on a first metal or metallic surface comprising a metal or metallic film relative to a second surface comprising a dielectric film on a substrate by alternately and sequentially contacting the substrate with a first precursor comprising a vapor phase metal halide reactant and second reactant comprising water vapor. In some embodiments the metal halide reactant does not comprise W.

In some embodiments a metal oxide film is selectively deposited on a first surface of a substrate comprising a metal oxide or dielectric surface relative to a second surface of the same substrate comprising an $SiO_2$ surface by alternately and sequentially contacting the substrate with a first precursor comprising a vapor phase metal halide reactant and a second reactant comprising water vapor. For example, in some embodiments a metal oxide such as $NbO_x$ or $TaO_x$ is selectively deposited on a first surface comprising a metal oxide or dielectric surface relative to a second surface comprising $SiO_2$ by alternately and sequentially contacting the substrate with a first precursor comprising a metal halide reactant and a second reactant comprising an oxygen reactant such as water vapor. In particular, in some embodiments $NbO_x$, such as $Nb_2O_5$ can be deposited on a metal oxide such as tungsten oxide, hafnium oxide, titanium oxide, aluminum oxide, or zirconium oxide from $NbF_5$ and $H_2O$.

In some embodiments the thin film that is selectively deposited comprises oxygen and one of niobium or tantalum. In some embodiments the thin film that is selectively deposited comprises $NbO_x$ or $TaO_x$, where x is from about 2 to about 2.75. For simplicity, materials, such as films, may be referred to herein by the formula $MO_x$, where M is a metal. The formula $MO_x$ indicates that the material comprises primarily a metal, M, and oxygen, however impurities may also be present in such a material. In some embodiments the formula $MO_x$ indicates that the material is an oxide of the metal M.

In some embodiments the thin film that is selectively deposited is a metal silicide. In some embodiments the metal silicide may be formed, for example, by a deposition process as described herein and including a second reactant comprising a disilane or trisilane.

In some embodiments the thin film that is selectively deposited is a metal carbide film. In some embodiments the metal carbide film may be formed by a deposition process as described herein and including a second reactant comprising an alkylsilane.

In some embodiments the thin film that is selectively deposited is a metal nitride.

In some embodiments the substrate is contacted with the first precursor comprising a metal halide at a deposition temperature of above about 225° C. In some embodiments the deposition temperature is above about 250° C., above about 275° C. or above about 300° C. In some embodiments the deposition temperature is between about 250° C. and about 350° C. or between about 295° C. and about 315° C. In some embodiments the temperature is less than about 600° C., less than about 500° C. or less than about 450° C.

In some embodiments a deposition as described herein may become increasingly selective as temperature is increased, for example from about 225° C. to about 300° C., with nearly complete selectivity seen at above about 300° C. in some instances, but not necessarily all instances. Selectivity can be given as a percentage calculated by [(deposition on metal or metallic surface)−(deposition on dielectric surface)]/(deposition on the metal or metallic surface). Deposition can be measured in any of a variety of ways, for example in some embodiments deposition may be given as the measured thickness of the deposited material. In some embodiments deposition may be given as the measured amount of material deposited.

In some embodiments selectivity is greater than about 50%, greater than about 60%, greater than about 70%, greater than about 80%, greater than about 90%, greater than about 95%, greater than about 99% or even greater than about 99.5%.

In some embodiments deposition only occurs on the first surface and does not occur on the second surface. In some embodiments deposition on the first surface of the substrate relative to the second surface of the substrate is at least about 80% selective, which may be selective enough for some particular applications. In some embodiments the deposition on the first surface of the substrate relative to the second surface of the substrate is at least about 50% selective, which may be selective enough for some particular application. However, in some embodiments some deposition may occur on the second surface.

For simplicity, a process may be referred to herein as a selective deposition process because the end result of such a process is a selective amount of deposited material on a first surface relative to a second surface. As such, selectivity as used herein refers to the end result of a deposition process and does not necessarily refer only to selective deposition. In some embodiments selectivity can include, for example, inherent etching during a deposition process which preferentially etches the deposited material on the second surface relative to the deposited material on the first surface, thereby achieving selective formation of the material on the first surface relative to the second surface.

In some embodiments deposition on the first surface of the substrate relative to the second surface of the substrate can be performed up to about 500 deposition cycles before losing the selectivity, or up to about 50 deposition cycles, or up to about 20 deposition cycles, or up to about 10 deposition cycles, or up to about 5 deposition cycles before losing selectivity. In some embodiments even deposition of 1 or 2 cycles before losing selectivity can be useful.

A loss of selectivity can be understood to have occurred when the selectivities mentioned above are no longer met. Depending on the specific circumstances, a loss of selectivity may be considered to have occurred when deposition on the first surface of the substrate relative to the second surface of the substrate is less than about 90% selective, less than about 95% selective, less than about 96%, 97%, 98% or 99% selective or greater.

In some embodiments deposition on the first surface of the substrate relative to the second surface of the substrate can be performed up to a thickness of about 50 nm before losing the selectivity, or up to about 10 nm, or up to about 5 nm, or up to about 3 nm, or up to about 2 nm, or up to about 1 nm before losing selectivity. Depending on the specific circumstances, a loss of selectivity may be considered to have occurred when deposition on the first surface of the substrate relative to the second surface of the substrate is less than about 90% selective, less than about 95% selective, less than about 96%, 97%, 98% or 99% selective or greater.

In some embodiments the film is deposited on the metal or metallic surface with a selectivity of greater than about 10 relative to the second dielectric surface at a thickness of about 0.5 to about 50 nm (10 times less deposition occurs on the second dielectric surface).

In some embodiments the film is deposited on the metal or metallic surface with a selectivity of at least 98% at a thickness of about 0.5 to about 100 nm.

In some embodiments the film is deposited on the metal or metallic surface with a selectivity of at least 98% at a thickness of more about 20 nm, more than about 50 nm or more than about 100 nm.

In some embodiments the film is deposited on the metal or metallic surface with a selectivity of greater than about 20 relative to the second dielectric surface at a thickness of about 0.5 to about 50 nm (20 times less deposition occurs on the second dielectric surface).

In some embodiments the film is deposited on the metal or metallic surface with a selectivity of greater than about 40 relative to the second dielectric surface at a thickness of about 0.5 to about 50 nm (40 times less deposition occurs on the second dielectric surface).

In some embodiments the film is deposited on the metal or metallic surface with a selectivity of greater than about 15, greater than about 25, or greater than about 50 relative to the second dielectric surface at a thickness of about 0.5 to about 10 nm.

In some embodiments the film is deposited on the metal or metallic surface with a selectivity of greater than about 25 or greater than about 50 relative to the second dielectric surface at a thickness of about 0.5 to about 5 nm.

In some embodiments the film is deposited on the metal or metallic surface with a selectivity of greater than about 10, greater than about 20 or greater than about 40 after from about 1 to 25 deposition cycles, from about 1 to 50 deposition cycles, from about 1 to 100 deposition cycles or from about 1 to 150 deposition cycles.

In some embodiments the film is deposited on the metal or metallic surface with a selectivity of greater than about 10, greater than about 20 or greater than about 40 after from about 1 to 50 deposition cycles, from about 1 to 100 deposition cycles, from about 1 to 250 deposition cycles or from about 1 to 500 deposition cycles.

In some embodiments, no measurable deposition takes place on the second dielectric surface with up to 25, 50, 100 or even 200 cycles. In some embodiments less than 0.1 nm of material is deposited on the second dielectric surface with up to 25, 50, 100 or even 200 cycles. In some embodiments less than 0.3 nm of material is deposited on the second dielectric surface with up to 50, 100, 250 or even 500 deposition cycles.

Embodiments of the invention may be directed to selective deposition of metal oxide on micrometer-scale (or smaller) features during integrated circuit fabrication. In some embodiments the selective deposition can be applied for manufacturing of features having a size less than 100 micrometers, less than 1 micrometer, or less than 200 nm. In the case of selective deposition on metal surfaces, the size of the feature or line width may be less than 1 micrometer, less than 200 nm, less than 100 nm, or less than 50 nm or less than 30 nm or less than 20 nm. One of ordinary skill in the art may recognize that selective deposition on larger features or smaller features and in other contexts is possible using the disclosed methods.

In some embodiments the selectively deposited film may comprise impurities, such as halogens, for example, fluorine, at concentrations of less than about 20 at-%, less than about 10 at-%, less than about 5 at-%, less than about 2 at-%, less than about 1 at-% or less than about 0.5 at-%.

In some embodiments the selectively deposited film has etch selectivity relative to $SiO_2$, for example in dilute HF. In some embodiments the wet etch selectivity relative to $SiO_2$ is greater than 1:5, greater than 1:10, or greater than 1:20 in dilute HF.

In some embodiments an etch step may be used subsequent to or in the course of deposition to remove material that is non-selectively deposited. In some embodiments the etch process may be a wet etch process or a dry etch process. In some embodiments the etch process is a dry etch process.

ALD Type Processes

ALD type processes are based on controlled, self-limiting surface reactions of precursor chemicals. Gas phase reactions are avoided by alternately and sequentially contacting the substrate with the precursors. Vapor phase reactants are separated from each other on the substrate surface, for example, by removing excess reactants and/or reactant byproducts from the reaction chamber between reactant pulses.

Briefly, a substrate comprising a first metal or metallic surface and second, dielectric surface is heated to a suitable deposition temperature, generally at lowered pressure. Deposition temperatures are discussed above.

The surface of the substrate is contacted with the vapor phase first reactant as discussed above. In some embodiments a pulse of vapor phase first reactant is provided to a reaction space containing the substrate. In some embodiments the substrate is moved to a reaction space containing vapor phase first reactant. In some embodiments conditions are selected such that no more than about one monolayer of the first reactant is adsorbed on the substrate surface in a self-limiting manner. Excess first reactant and reaction byproducts, if any, are removed from the substrate surface, such as by purging with an inert gas or by removing the substrate from the presence of the first reactant.

Purging means that vapor phase precursors and/or vapor phase byproducts are removed from the substrate surface such as by evacuating a chamber with a vacuum pump and/or by replacing the gas inside a reactor with an inert gas such as argon or nitrogen. Typical purging times are from about 0.05 to 20 seconds, between about 1 and 10, or between about 1 and 2 seconds. However, other purge times can be utilized if necessary, such as where highly conformal step coverage over extremely high aspect ratio structures or other structures with complex surface morphology is needed or batch processes with multiple substrates. In selective deposition longer purging times or efficient purging may be used in order to avoid CVD reactions which could possibly ruin the selectivity.

As discussed above, the surface of the substrate is subsequently contacted with a vapor phase second gaseous reactant in each deposition cycle. In some embodiments a pulse of a second gaseous reactant is provided to a reaction space containing the substrate. In some embodiments the substrate is moved to a reaction space containing the vapor phase second reactant. Excess second reactant and gaseous byproducts of the surface reaction, if any, are removed from the substrate surface.

The steps of contacting and removing are repeated until a thin film of the desired thickness has been selectively formed on the first surface of substrate.

Removing excess reactants can include evacuating some of the contents of a reaction space and/or purging a reaction space with helium, nitrogen or another inert gas. In some embodiments purging can comprise turning off the flow of the reactive gas while continuing to flow an inert carrier gas to the reaction space.

The precursors employed in the ALD type processes may be solid, liquid or gaseous materials under standard conditions (room temperature and atmospheric pressure), provided that the precursors are in vapor phase before they are contacted with the substrate surface. Contacting a substrate surface with a vaporized precursor means that the precursor vapor is in contact with the substrate surface for a limited period of time. Typically, the contacting time is from about 0.05 to 10 seconds. However, depending on the substrate type and its surface area, the contacting time may be even higher than 10 seconds. Contacting times can be on the order of minutes in some cases. The optimum contacting time can be determined by the skilled artisan based on the particular circumstances.

The mass flow rate of the precursors can also be determined by the skilled artisan. In some embodiments the flow rate of metal precursors is between about 1 and 1,000 sccm without limitation, or between about 100 and 500 sccm.

The pressure in a reaction chamber is typically from about 0.01 to about 20 mbar, or from about 1 to about 10 mbar. However, in some cases the pressure will be higher or lower than this range, as can be determined by the skilled artisan given the particular circumstances.

Examples of suitable reactors that may be used include commercially available ALD equipment such as the F-120® reactor, Pulsar® reactor and Advance® 400 Series reactor, available from ASM America, Inc. of Phoenix, Ariz. and ASM Europe B.V., Almere, Netherlands. In addition to these ALD reactors, many other kinds of reactors capable of ALD growth of thin films, including CVD reactors equipped with appropriate equipment and means for pulsing the precursors can be employed. In some embodiments a flow type ALD reactor is used. In some embodiments reactants are kept separate until reaching the reaction chamber, such that shared lines for the precursors are minimized. However, other arrangements are possible, such as the use of a pre-reaction chamber as described in U.S. patent application Ser. No. 10/929,348, filed Aug. 30, 2004 and Ser. No. 09/836,674, filed Apr. 16, 2001, the disclosures of which are incorporated herein by reference.

The growth processes can optionally be carried out in a reactor or reaction space connected to a cluster tool. In a cluster tool, because each reaction space is dedicated to one type of process, the temperature of the reaction space in each module can be kept constant, which improves the throughput compared to a reactor in which is the substrate is heated up to the process temperature before each run.

A stand-alone reactor can be equipped with a load-lock. In that case, it is not necessary to cool down the reaction space between each run.

Example 1

A deposition process as described herein as carried out in a reaction chamber. $NbF_5$ was used as a first precursor and $H_2O$ was used as a second reactant. The first precursor and second reactant were alternately and sequentially pulsed into the reaction space of a Pulsar® 2000 reactor, wherein the reactants separately contacted various sample substrates at reaction temperature of about 300° C. The reactants were removed from the reaction space between pulses by purging the reaction space. The pulse and purge times used for the first precursor comprising $NbF_5$ were from about 0.5 s to about 2.0 s (pulse) and about 6.0 s (purge), respectively. Pulse and purge times used for the second reactant comprising $H_2O$ were from about 0.5 s to about 2.0 s (pulse) and 5.0 s to about 6.0 s (purge), respectively.

Figure 2:
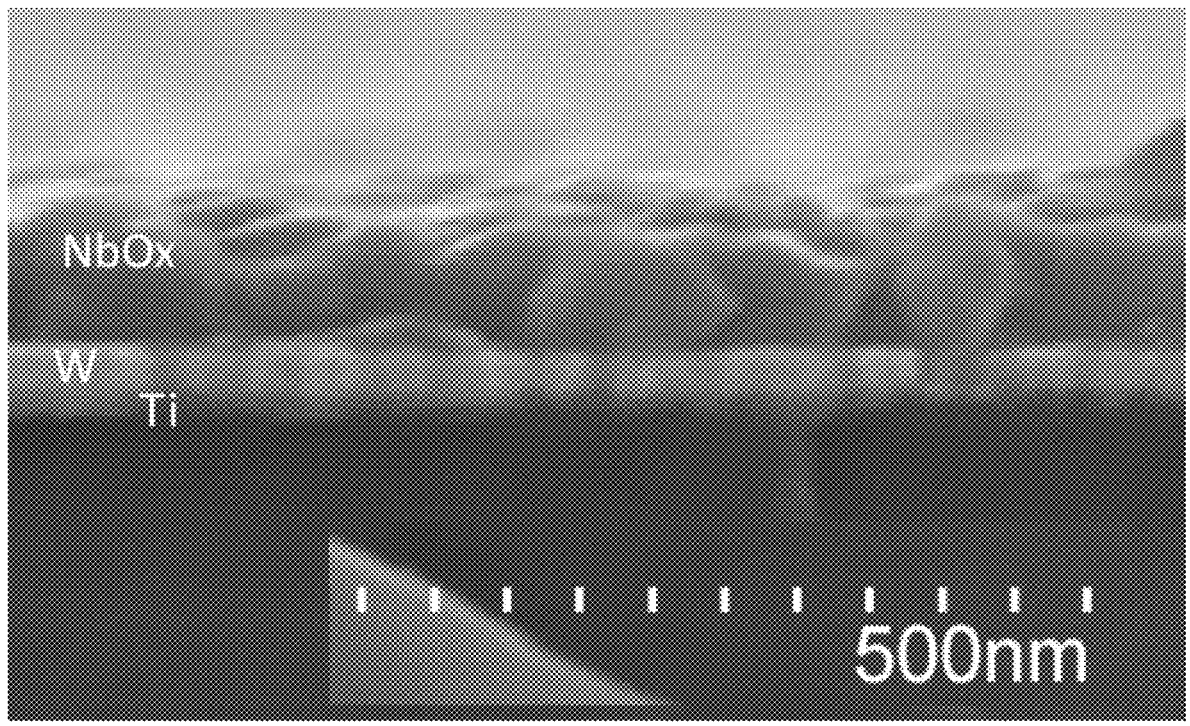
FIG. 2 is a cross sectional scanning electron micrograph showing approximately 100 nm of $NbO_x$ deposited on a 20 nm to 30 nm thick layer of tungsten deposited by a physical vapor deposition (PVD) process on approximately a 20 nm thick layer of Ti.

During analysis of the sample substrates, no film growth was observed on native oxide or silicon surfaces of the substrates for deposition processes including at least up to 200 cycles or at least up to 300-500 cycles in the case of substrates including a thermal $SiO_2$ surface. Film growth was observed on a PVD deposited W surfaces of the sample substrates as shown in FIG. 2. Film growth was also observed on sample substrates which included a PVD deposited Co surface and a PVD deposited Ru surface.

Example 2

$NbO_x$ films were selectively deposited on a metal oxide surface of a substrate relative to a $SiO_2$ surface using a deposition process as described herein.

A deposition process as described herein as carried out in a reaction chamber. $NbF_5$ was used as a first precursor and $H_2O$ was used as a second reactant. The first precursor and second reactant were alternately and sequentially pulsed into the reaction space of a Pulsar® 2000 reactor, wherein the reactants separately contacted various sample substrates at reaction temperature of about 300° C. Source temperatures for $NbF_5$ and $H_2O$ reactants were 45° C. and about 21° C., respectively. The reactants were removed from the reaction space between pulses by purging the reaction space. The pulse and purge times used for the first precursor comprising $NbF_5$ were from about 0.5 s to about 2.0 s (pulse) and about 6.0 s (purge), respectively. Pulse and purge times used for the second reactant comprising $H_2O$ were from about 0.5 s to about 2.0 s (pulse) and 5.0 s to about 6.0 s (purge), respectively.

Under these deposition conditions, an $Nb_2O_5$ film was observed to be deposited on the first metal oxide surface of the substrate using a deposition process including 500 deposition cycles. The substrate comprised an $SiO_2$ surface with tungsten dots that included a native tungsten oxide surface layer, also referred to herein as tungsten/tungsten oxide areas.

Figure 3:
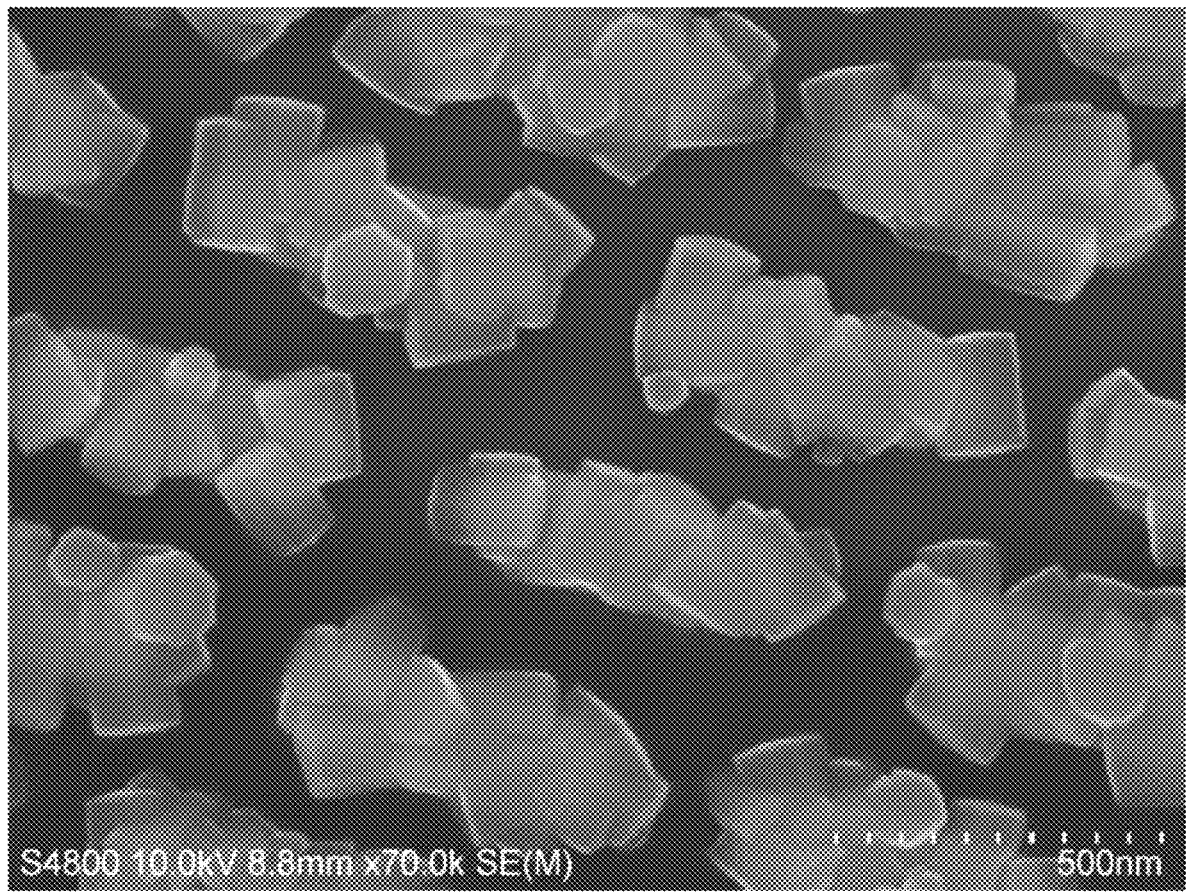
FIG. 3 is a scanning electron micrograph of an $Nb_2O_5$ film which has been selectively deposited on a tungsten/tungsten oxide surface of a substrate relative to the $SiO_2$ surface of the same substrate.

Due to the selectivity of the deposition process, an $Nb_2O_5$ thin film was deposited only on the portions of the substrate surface comprising tungsten/tungsten oxide dots. No film deposition was measured on the $SiO_2$ surface when analyzed via energy-dispersive X-ray spectroscopy (EDX). FIG. 3 shows an SEM image of the resultant $Nb_2O_5$ on the tungsten/tungsten oxide surface. The $Nb_2O_5$ was observed as large crystals on the tungsten/tungsten oxide dots having a thickness of about 80 nm. The thickness of the film was estimated from a film deposited using a similar deposition process with similar conditions on a blanket PVD W coupon.

We claim:

1. A method for selectively depositing a metal oxide film on a first metal oxide surface of a substrate relative to a second dielectric surface of the substrate, the method comprising one or more deposition cycles comprising alternately and sequentially contacting the substrate with a vapor phase first reactant comprising a metal halide and a vapor phase second reactant comprising OH bonds,
   wherein the substrate is contacted with the first reactant at a temperature equal to or above about 225° C., and
   wherein the metal oxide film is deposited on the first metal oxide relative to the second dielectric surface with a selectivity of above about 50%.

2. The method of claim 1, wherein the vapor phase second reactant comprises water.

3. The method of claim 1, wherein the vapor phase second reactant comprises $H_2O_2$.

4. The method of claim 1, wherein the second dielectric surface comprises Si—O bonds.

5. The method of claim 1, wherein the second dielectric surface comprises $SiO_2$.

6. The method of claim 5, wherein the metal oxide is deposited on the first metal oxide surface relative to the second dielectric surface comprising $SiO_2$ with a selectivity of above about 95%.

7. The method of claim 1, wherein the second dielectric surface comprises —OH group surface terminations.

8. The method of claim 1, wherein the second dielectric surface comprises $GeO_2$.

9. The method of claim 1, wherein the first metal oxide surface is an oxidized surface of a metallic material.

10. The method of claim 1, wherein the first metal oxide surface is created by oxidizing at least the surface of a metallic material using an oxygen compound.

11. The method of claim 1, wherein the first metal oxide surface comprises tungsten oxide, hafnium oxide, titanium oxide, aluminum oxide, or zirconium oxide.

12. The method of claim 1, wherein the deposited metal oxide film comprises $NbO_x$.

13. The method of claim 1, wherein the metal halide is selected from fluorides or chlorides of Nb, Ta, Mo, W, V, or Cr.

14. The method of claim 1, wherein the metal halide is selected from $NbCl_5$, $NbF_5$, $TaCl_5$, $TaF_5$, $MoF_x$, $MoCl_x$, $VF_x$, $VCl_x$, and $CrF_x$.

15. The method of claim 1, wherein the metal halide is selected from $NbCl_5$, $NbF_5$, $TaCl_5$, and $TaF_5$.

16. The method of claim 1, wherein the metal halide does not comprise tungsten.

17. The method of claim 1, wherein there is no measurable deposition of metal oxide on the second dielectric surface of the substrate after 100 deposition cycles.

18. The method of claim 1, wherein the metal oxide film is deposited on the first metal oxide surface relative to the second dielectric surface with a selectivity of above about 95%.

19. The method of claim 1, wherein the substrate is contacted with the first vapor-phase reactant comprising a metal halide at a temperature equal to or above about 300° C.

20. The method of claim 1, wherein the substrate is contacted with the first vapor-phase reactant comprising a metal halide at a temperature equal to or above about 250° C. and the metal oxide film is deposited on the first metal oxide surface relative to the second dielectric surface with a selectivity of above about 95%.

* * * * *